United States Patent [19]

Honda

[11] Patent Number: 5,444,419

[45] Date of Patent: Aug. 22, 1995

[54] POWER AMPLIFIER HAVING A TEMPERATURE COMPENSATION CIRCUIT

[75] Inventor: Jun Honda, Tokyo, Japan

[73] Assignee: Pioneer Electronic Corporation, Tokyo, Japan

[21] Appl. No.: 205,256

[22] Filed: Mar. 3, 1994

[30] Foreign Application Priority Data

Mar. 5, 1993 [JP] Japan .................. 5-045570

[51] Int. Cl.⁶ ................................... H03F 3/30
[52] U.S. Cl. ...................... 330/266; 330/267; 330/311
[58] Field of Search ............... 330/266, 267, 268, 311

[56] References Cited

U.S. PATENT DOCUMENTS 4,406,990  9/1983  Noro ................ 330/267 X

*Primary Examiner*—James B. Mullins
*Attorney, Agent, or Firm*—Nikaido, Marmelstein, Murray & Oram

[57] ABSTRACT

First and second power transistors collectors of which are connected with each other, other first and second loss sharing transistors connected to bases of the first and second power transistors at collectors thereof, respectively. A first driver transistor is connected to the emitter of the first loss sharing transistor at the collector thereof, and a second driver transistor is connected to the emitter of the second loss sharing transistor at the collector thereof. The base of each of the loss sharing transistors is applied with a constant voltage at the base thereof.

1 Claim, 6 Drawing Sheets

POWER AMPLIFIER HAVING A TEMPERATURE COMPENSATION CIRCUIT

FIELD OF THE INVENTION

The present invention relates to a power amplifier provided in an audio device, and more particularly to a power amplifier having a push-pull output stage where an output is produced through collectors of transistors (a common-emitter connection).

BACKGROUND OF THE INVENTION

FIG. 5 shows a conventional class B push-pull power amplifier having an output stage of a collector output type. The power amplifier comprises an output stage having a pair of power transistors Q1 and Q2, and a driver stage having a pair of driver transistors Q3 and Q4. Both of the power transistors Q1 and Q2 are connected to each other at collectors thereof and led to an output terminal OUT. The driver transistors Q3 and Q4 are provided for driving the power transistors Q1 and Q2, respectively.

In the power amplifier of the collector output type, loss at the driver transistors Q3 and Q4 becomes large compared with a power amplifier having an output stage where the output is produced through an emitter as described below. In the power amplifier of the emitter output type, an emitter-collector voltage decreases as the base current of the power transistor increases, so that the loss at the driving transistors is small. To the contrary, in the power amplifier of the collector output type, if the base current of each of the power transistors Q1 and Q2 increases, temperature of each of the driver transistors Q3 and Q4 increases. Thus, the base-emitter voltage (Vbe), of each of the driver transistors Q 3 and Q4 decreases, so that the bias current of the driver transistor increases to increase the loss at the transistor.

In order to eliminate such a disadvantage, the power amplifier is provided with a temperature compensation circuit. The circuit comprises a pair of diodes D1 and D2 connected to the collectors of the driver transistors Q3 and Q4 and a thermistor S connected to bases of the driver transistors Q3 and Q4. The diodes D1 and D2 and the thermister S are thermally coupled with the transistors Q1 and Q2 so as to receive the heats of the transistors.

In place of the thermistor S, a bias setting and temperature compensation circuit B is provided as shown in FIG. 6. The bias voltage setting and temperature compensation circuit B is a constant voltage circuit and comprises a bias setting transistor Q5, and a pair of resistors R11 and R12 connected between input voltages Vi+ and Vi−'and a base of the transistor Q5. The voltage between the bases of the driver transistors Q3 and Q4 is the value obtained by multiplying the base-emitter voltage VBE of the transistor Q5 and (R11+R12)/R12. Thus, the voltage between the bases of the driver transistors Q3 and Q4 is compensated by the change of the voltage VBE of the transistor Q5 dependent on temperature change.

However, in such a circuit, the temperature of the driver transistor increases with the bias current, which causes a vicious circle of heat. Therefore, it is necessary to provide a complicated circuit for the temperature compensation.

Furthermore, in the circuit of FIG. 6, the voltage between the bases of the transistors is compensated with respect to the heat by the temperature change of $V_{BE}$ of the transistor Q5 at a temperature coefficient which is (R11+R12)/R12 times of as large as the temperature coefficient of the transistor Q5. In order to provide a superfluous temperature compensation, if the total of temperature coefficient of the voltage $V_{BE}$ of the driver transistors Q3 and Q4 is −4 mV/° C., the temperature coefficient of the circuit B must be increased over the total value.

SUMMARY OF THE INVENTION

An object of the present invention is to provide a power amplifier where loss of a driver transistor is reduced to provide a sufficient temperature compensation with a simple structure.

According to the present invention, there is provided a power amplifier comprising a pair of power transistors collectors of which are connected with each other, a pair of loss sharing transistors connected to bases of the power transistors, respectively, a pair of driver transistors connected to the loss sharing transistors in cascode connection, and source means for applying a constant voltage to a base of each of the loss sharing transistors.

In an aspect of the invention, each of the loss sharing transistors is connected to the base of the corresponding power transistor at a collector thereof, and connected to a collector of the corresponding driver transistor at an emitter thereof.

The present invention further provides a power amplifier comprising a first power transistor and a second power transistor, collectors of both transistors being connected with each other, first and second driver transistors connected to bases of the first and second power transistors, respectively, a capacitor connected between bases of the first and second driver transistors, a bias setting transistor applied with a supply voltage, a first diode connected to the base of the first driver transistor at a cathode thereof and connected to a collector of the bias setting transistor at an anode thereof, a second diode connected to the base of the second driver transistor at an anode thereof and connected to an emitter of the bias setting transistor at a cathode thereof, and a pair of resistors connected with each other in series and connected to the collector and emitter of the bias setting transistor at both ends thereof and connected to a base of the bias setting transistor at a junction between the resistors.

Other objects and features of this invention will become understood from the following description with reference to the accompanying drawings.

DETAILED DESCRIPTION OF THE PREFERRED EMBODIMENTS

Figure 1:
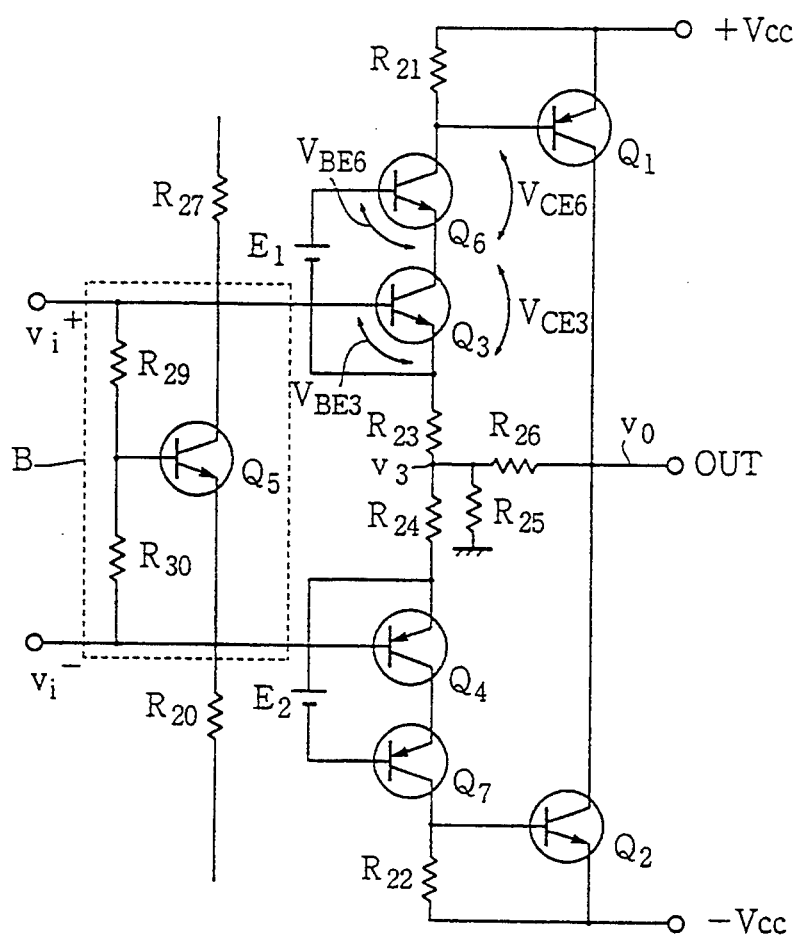
FIG. 1 shows a circuit of a class B push-pull power amplifier having an output stage of a collector output type (a common emitter connection) according to the present invention.

Referring to FIG. 1, a class B push-pull power amplifier having a collector output type (a common emitter connection) according to the present invention comprises the output state having first and second power transistors Q1 and Q2, a driver stage, and a bias voltage setting and temperature compensation circuit B. The driver stage comprises first and second driver transistors Q3 and Q4, first and second loss sharing transistors Q6 and Q7, and first and second constant voltage source E1 and E2. The bias voltage setting and temperature compensation circuit comprises the bias setting transistor Q5 and resistors R29 and R30.

The first power transistor Q1 is a PNP transistor and the second power transistor Q2 is an NPN transistor. A positive power source +Vcc is connected to the base of the first power transistor Q1 through a resistor R21 and to the emitter thereof. The collector of the transistor Q1 is connected to the output terminal OUT. A negative power source −Vcc is connected to the base of the second power transistor Q2 through a resistor R22 and to the emitter thereof. The collector of the transistor Q2 is connected to the output terminal OUT.

In the driver stage, the first driver transistor Q3 and the first loss sharing transistor Q6 are NPN transistors and the second driver transistor Q4 and the second loss sharing transistor Q7 are PNP transistors. The input voltage Vi + is applied to the base of the first driver transistor Q3. The positive electrode of the first constant voltage source E1 is connected to the base of the first loss sharing transistor Q6, the emitter of the transistor Q6 is connected to the collector of the transistor Q3 in the cascode connection. The collector of the transistor Q6 is connected to the base of the first power transistor Q1. The negative electrode of the source E1 is connected to the emitter of the first driver transistor Q3. The input voltage vi − is applied to the base of the second driver transistor Q4, a negative electrode of the second constant voltage source E2 is connected to the base of the second loss sharing transistor Q7, the emitter of the transistor Q7 is connected to the collector of the transistor Q4 in the cascode connection. The collector of the transistor Q7 is connected to the base of the second power transistor Q2. The positive electrode of the source E2 is connected to the emitter of the second driver transistor Q4.

The emitter of the first transistor Q3 is connected to the emitter of the second transistor Q4 through resistors R23 and R24 in series. The output terminal OUT is connected to ground through resistors R26 and R25.

In operation, the constant voltages of the sources E1 and E2 are applied to the bases of the transistors Q6 and Q7 so as to apply the constant voltages to the emitters of the transistors Q3 and Q4, so that the heat of the transistors Q3 and Q4 is transferred to the transistors Q6 and Q7.

If the collector to emitter voltage of the first driver transistor Q3 is $V_{CE3}$ the emitter to base voltage of the transistor Q6 is $V_{BE6}$ and the voltage of the first constant voltage source E1 is E, the voltage $V_{CE3}$ is given as follows.

$$V_{CE3} = E - V_{BE6} \quad (1)$$

Thus, the voltage $V_{CE3}$ becomes constant. Although the loss at the transistor Q3 increases in proportion to the increase of the input voltage vi+, since the voltage $V_{CE3}$ is set to a low value, the loss is remarkably reduced compared with the conventional amplifier. Consequently, the heat rising of the transistor Q3 is suppressed, whereby the voltage $V_{BE3}$ does not change. The bias current to the first power transistor Q1 is stabilized, thereby preventing overheat of the transistors.

In the second power transistor Q2, the same effect is obtained.

In the embodiment, when the power source ±Vcc was set to ±50 V and constant voltage was set to 4V, the heat of the transistors Q3 and Q4 were suppressed 1/30 in average in the normal using conditions.

Since the loss sharing transistor is connected to the driver transistor in the cascode connection, the collector to emitter voltage of the driver transistor is fixed. Thus, change of the bias current to the power transistor caused by change of power source ±Vcc is reduced. The power amplifier can be changed to another amplifier having a different output by changing the source voltage Vcc without changing the components. Therefore, it is possible to use the circuit for various equipments.

Figure 2:
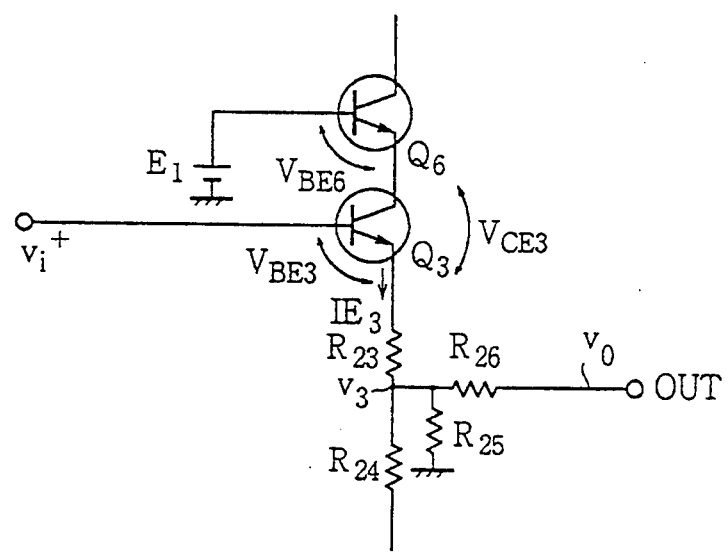
FIG. 2 is a circuit diagram showing a main part of a modification of FIG. 1.

FIG. 2 is a modification of the circuit of FIG. 1. In the modification, the negative electrode of the first constant voltage source E1 is connected to ground. Other structures are the same as the embodiment of FIG. 1.

The voltage $V_{CE3}$ is given by an equation as follows.

$$\begin{aligned} V_{CE3} &= (E - V_{BE6}) - (vi^+ - V_{BE3}) \\ &\approx E - vi^+ \end{aligned} \quad (2)$$

Although the emitter current $I_{E3}$ of the transistor Q3 increases in proportion to the input voltage vi+, the voltage $V_{CE3}$ is reduced to reduce the loss of the transistor Q3.

Figure 3:
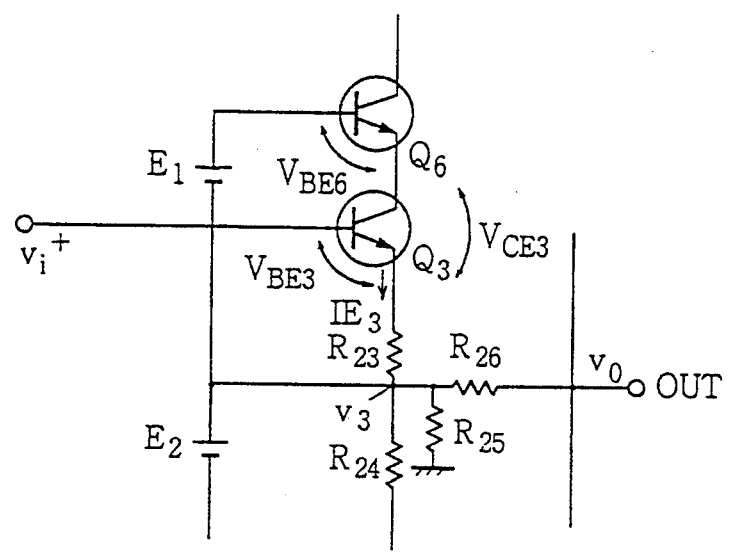
FIG. 3 is a circuit diagram showing a main part of another modification of FIG. 1.

FIG. 3 shows another modification of FIG. 1 in which the negative electrode of the first constant voltage source E1 is connected to the positive electrode of the second constant voltage source E2. The junction is led to the junction between the resistors R23 and R24. Other structures are the same as the first embodiment.

The voltage $V_{CE3}$ is represented as follows.

$$\begin{aligned} V_{CE3} &= (E - V_{BE6}) - (vi^+ - V_{BE3}) - I_{E3};R23 \\ &= E - vi^+ - I_{E3};R23 \end{aligned} \quad (3)$$

The loss of the first driver transistor Q3 is further reduced.

The second driver transistor Q4 is provided with the same effect.

Figure 4:
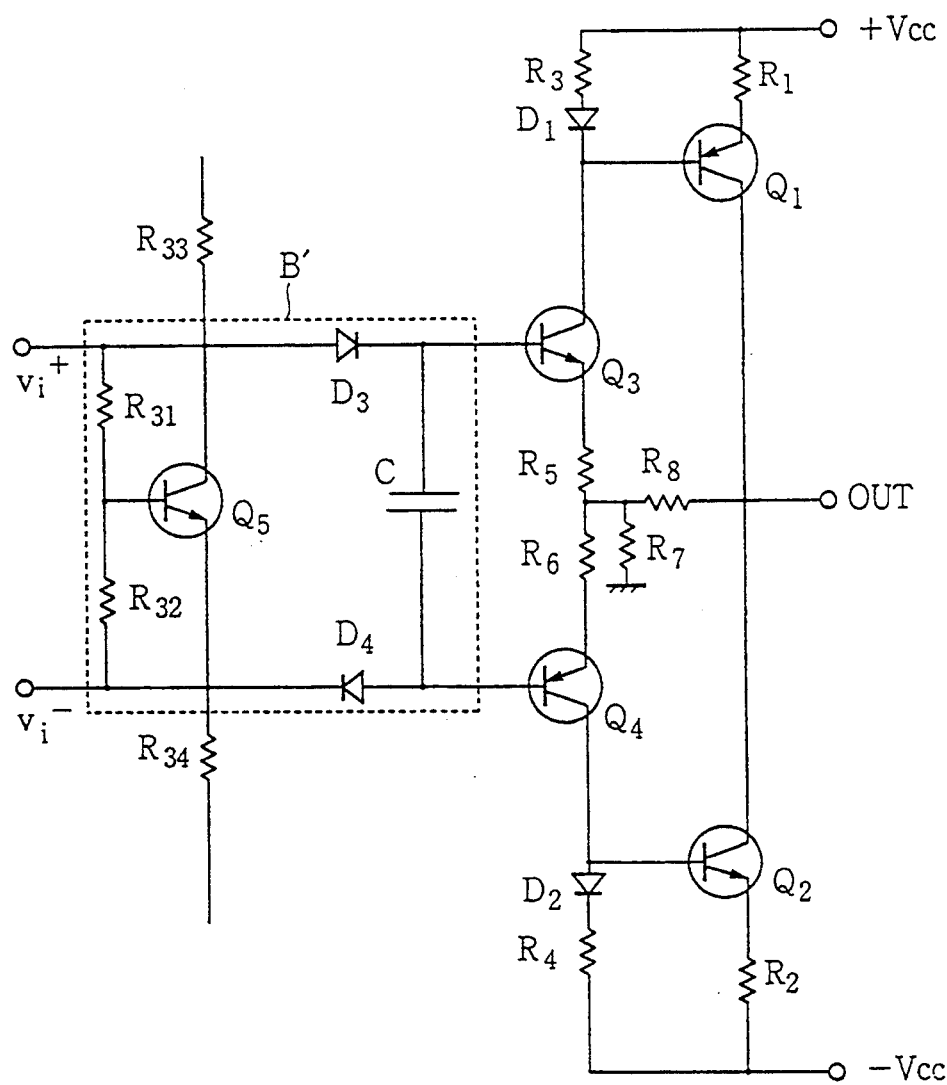
FIG. 4 shows a circuit of a second embodiment of the present invention.

FIG. 4 shows a second embodiment of the present invention. In the embodiment, a bias voltage setting circuit B' is provided in the power amplifier shown in FIG. 5 in place of the thermistor S. The circuit B' comprises a bias setting transistor Q5 and resistors R31 and R32, which are the same as the circuit B of FIG. 6. Namely, the voltage between the bases of the transistors Q3 and Q4 is (R31+R32)/R32 times as large as the base-emitter voltage of the transistor Q5, and is compensated in temperature.

In the circuit, a pair of first and second diodes D3 and D4, and a capacitor C are further provided for increasing the temperature compensation. The transistor Q5 is thermally coupled with the transistors Q3 and Q4.

The diodes D3 and D4 are located at a position where change of the temperature is small.

Figure 5:
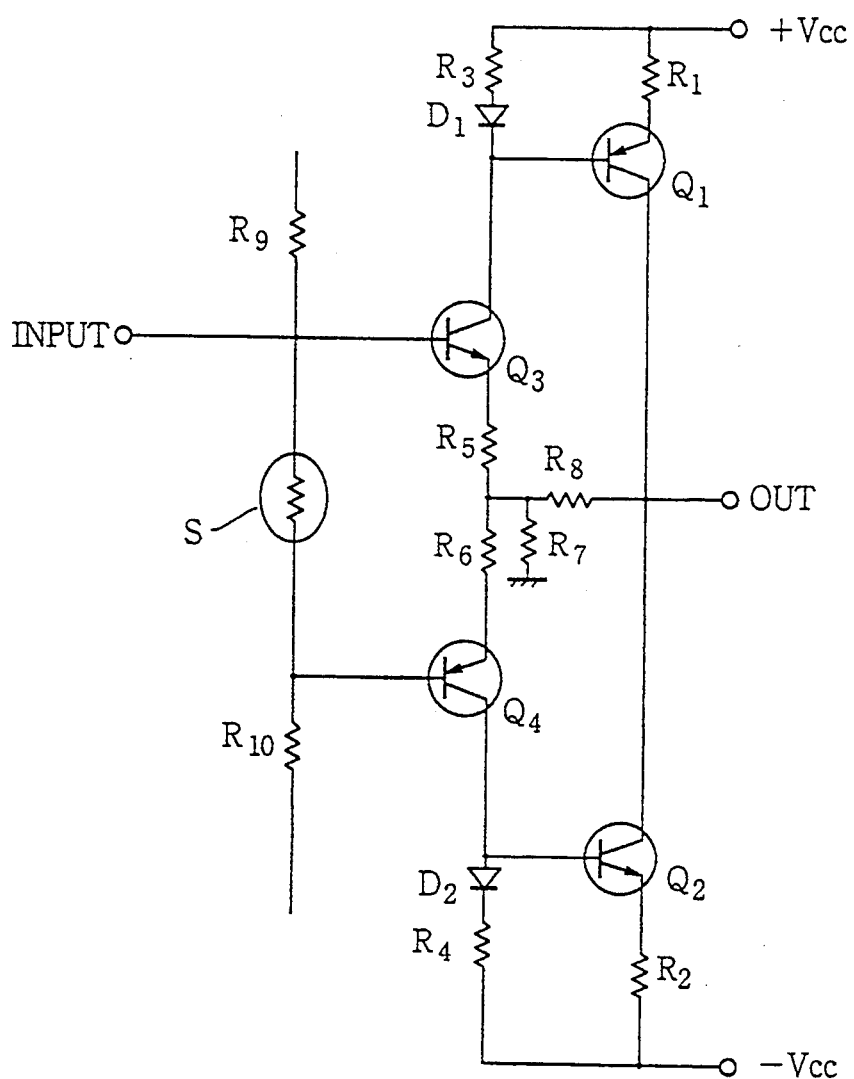
FIG. 5 shows a conventional power amplifier.
Figure 6:
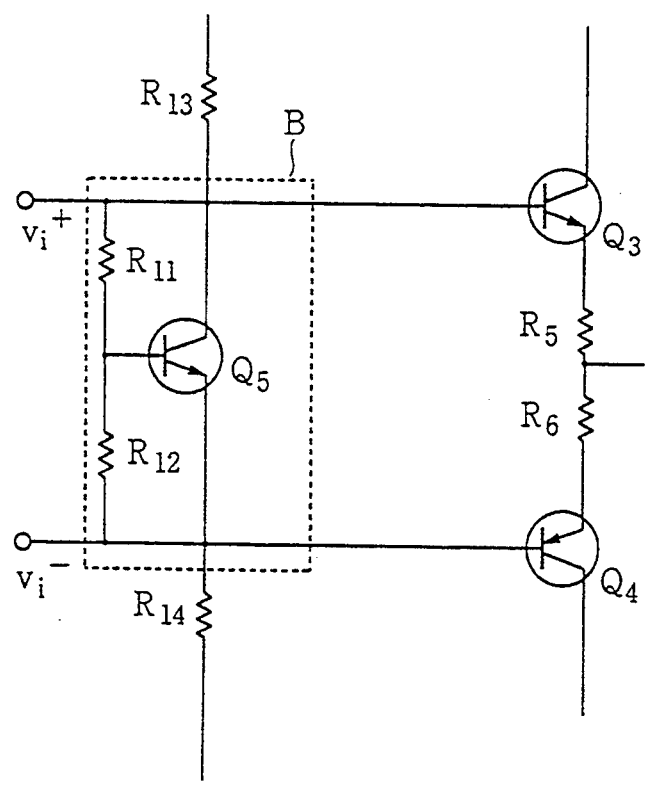
FIG. 6 shows another conventional power amplifier.

Other structures are the same as those in FIG. 5.

The cathode of the first diode D3 is connected to the base of the first driver transistor Q3 and the anode thereof is connected to the collector of the transistor Q5. The anode of the second diode D4 is connected to the base of the second driver transistor Q4 and the cathode thereof is connected to the emitter of the transistor Q5. The capacitor C is connected to the cathode of the first diode D3 and to the anode of the second diode D4.

In the circuit, since the diodes D3 and D4 cause the voltage between the bases of transistors Q3 and Q4 to drop without changing the temperature of the transistors, a multiple $(R31+R32)/R32$ can be set to a large value by the value of voltage drop. Thus, the temperature coefficient multiplied by $(R31+R32)/R32$ of the voltage $V_{BE}$ of the bias transistor Q5 becomes larger than the total of the temperature coefficients of the voltages $V_{BE}$ of the driver transistors Q3 and Q4, thereby providing superfluous compensation.

In the compensation circuit without the diodes D3, D4, when the second driver transistor Q4 is turned on and the first driver transistor Q3 is turned off, the carrier in the base of the first transistor Q3 is turned off, the carrier in the base of the first transistor Q3 is drained by the current passing through the transistor Q5, thereby turning off the transistor Q3 at a high speed. However, in the embodiment, the diodes D3 and D4 provided in the circuit prevent the carrier from draining so that a storage time of the transistor is increased. Therefore, the transistors Q3 and Q4 can not be quickly turned on and off. The capacitor C provided between the bases of the driver transistors Q3 and Q4 operates to drain the carrier. Thus, the driver transistor can be switched at high speed. Consequently, the storage time of the transistors Q3 and Q4 is maintained at a short time even though an output of high frequency is input, thereby preventing cross current.

The circuit B' may be provided in the circuit of the first embodiment, thereby ensuring the temperature compensation.

The embodiments of the present invention can be used in a class A or class AB push-pull amplifier with the same effects.

In accordance with the present invention, the loss of the driver transistor is reduced, thereby preventing the overheat of the transistor. Consequently, the temperature compensation is sufficiently achieved with a simple structure.

Furthermore, the temperature compensation for the driver transistor is increased to provide superfluous compensation. In addition the switching operation of the transistors can be maintained at high speed.

While the presently preferred embodiments of the present invention have been shown and described, it is to be understood that these disclosures are for the purpose of illustration and that various changes and modifications may be made without departing from the scope of the invention as set forth in the appended claims.

What is claimed is:

1. A power amplifier comprising:
a first power transistor and a second power transistor, collectors of both transistors being connected with other;
first and second driver transistors connected to bases of the first and second power transistors, respectively;
a capacitor connected between bases of the first and second driver transistors;
a bias setting transistor applied with a supply voltage;
a first diode connected to the base of the first driver transistor at a cathode thereof and connected to a collector of the bias setting transistor at an anode thereof;
a second diode connected to the base of the second driver transistor at an anode thereof and connected to an emitter of the bias setting transistor at a cathode thereof; and
a pair of resistors connected with each other in series and connected to the collector and emitter of the bias setting transistor at both ends thereof and connected to a base of the bias setting transistor at a junction between the resistors.

* * * * *